United States Patent

De Haes et al.

[11] 3,989,521
[45] Nov. 2, 1976

[54] PRODUCTION OF PLANOGRAPHIC PRINTING PATTERNS ON ALUMINUM SHEETS USING SOLUTIONS CONTAINING DICARBOXYLIC ACID COMPOUNDS

[75] Inventors: Louis Maria De Haes, Edegem; Camille Angelina Vandeputte, Mortsel; Leon Louis Vermeulen, Broechem, all of Belgium

[73] Assignee: AGFA-GEVAERT N.V., Mortsel, Belgium

[22] Filed: Feb. 10, 1975

[21] Appl. No.: 548,755

[30] Foreign Application Priority Data
Feb. 8, 1974    United Kingdom............... 5946/74

[52] U.S. Cl. .................................. 96/29 L; 96/33; 96/61 R; 96/61 M
[51] Int. Cl.² .................... G03C 5/54; G03F 7/02; G03C 5/38
[58] Field of Search............... 96/29 L, 29 R, 61 M, 96/61 R

[56] References Cited
UNITED STATES PATENTS

| | | | |
|---|---|---|---|
| 3,186,842 | 6/1965 | DeHaas et al. | 96/29 L |
| 3,300,306 | 1/1967 | Sevens et al. | 96/29 L |

*Primary Examiner*—David Klein
*Assistant Examiner*—Richard C. Schilling
*Attorney, Agent, or Firm*—A. W. Breiner

[57] ABSTRACT

A process of producing a planographic printing plate by forming a diffusion transfer image on an aluminium sheet or foil or on a supported aluminium layer serving as image receiving material wherein the diffusion transfer of silver complexes from an image-wise exposed light-sensitive silver halide material onto said image receiving material is brought about with an alkaline aqueous processing liquid containing at least one compound being within the scope of the following formula:

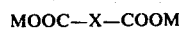

wherein X is either: —CH=CH—,

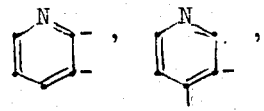

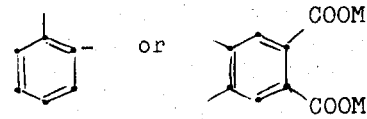

and M is an alkali metal.

6 Claims, No Drawings

PRODUCTION OF PLANOGRAPHIC PRINTING PATTERNS ON ALUMINUM SHEETS USING SOLUTIONS CONTAINING DICARBOXYLIC ACID COMPOUNDS

The present invention is concerned with photographic image-forming processes and materials used in the well-known silver complex diffusion transfer process to form planographic patterns on either an aluminium sheet, foil or plate or an aluminium covered support.

The principle of silver complex diffusion transfer has been described e.g. in the U.S. Pat. No., 2,352,014 and has been explained in detail in "Photographic Silver Halide Diffusion Transfer Processes" by A. Rott and E. Weyde — Focal Press London, New York 1972 and in the references cited therein.

In the silver complex diffusion transfer process, silver complexes are transferred image-wise by diffusion from a light-sensitive silver halide emulsion layer to an image-receiving layer, where the said silver complexes are converted optionally in the presence of development nuclei into a silver image. For this purpose it is usual for an image-wise exposed silver halide emulsion layer of one material to be brought into contact with an image-receiving layer of a separate material in the presence of a developing substance or a development-activating substance and a so-called silver halide solvent converting the non-exposed silver halide into soluble silver complexes. In the exposed parts of the silver halide emulsion layer, the silver halide is reduced by development to silver metal so that it cannot dissolve nor diffuse anymore. In the non-exposed parts of the silver halide emulsion layer, the silver halide is dissolved and converted into soluble silver complexes, which are transferred to the image-receiving layer where they form metallic silver, optionally in the presence of development nuclei and/or development agent or development-activating substances.

Silver complex diffusion transfer processes are widely used in all fields of reproduction work either to reproduce line originals or continuous tone originals. Details about these subjects can been found e.g. in the above cited book by A. Rott and E. Weyde, in J.O.S.A. Vol. 37 no. 2, 1947 and in the U.K. Pat. Application 29,792/73.

Silver complex diffusion is also used with good success in the preparation of planographic printing plates to form on the printing member areas having differentiated water-repellent and water-accepting characteristics. In this so-called offset printing field there are different ways to form the printing surface and make it ready for printing. For instance some methods use a light-sensitive member, which is exposed to the original and a separate image-receiving member for receiving the image formed according to the silver complex diffusion transfer process, whereas other methods use so-called mono-sheet materials wherein the light-sensitive layer and the image-receiving layer form parts of one member.

Once the image-receiving layer carries the transferred image i.e. as soon as the diffusion transfer process has come to an end, the image pattern formed is treated with a lithographic fixer solution to strengthen the differentiated hydrophilic and hydrophobic areas of the printing member. Additionally, the printing characteristics can be improved yet by treating the image pattern with a lacquer as described e.g. in U.S. Pat. No. 3,378,372.

Supports used in planographic printing may be composed of a wide variety of materials provided that they possess the required characteristics of rigidity, dimensional stability, dependability in hydrophilic and hydrophobic circumstances, etc.

Suitable supports are aluminium plates, foils or sheets and aluminium layer covered supports, the aluminium layer being deposited by lamination, vacuum deposition or other suitable means.

Planographic printing plates, using aluminium supports or aluminium-covered supports, can be divided mainly into two classes, viz. a class in which the aluminium foil, sheet or other member or the aluminium metal layer (either or not eloxated) has been provided with development nuclei, and a class in which no development nuclei are used.

The production of image-wise exposed planographic printing plates comprising an aluminium support or an aluminium-covered support, the aluminium support or the aluminium covering layer of the support as the case may be containing no development nuclei, has been described in the Belgian Pat. Specification No. 572,336.

In the method according to this Belgian Pat. Specification the transferred silver complexes are not converted into metallic silver by spontaneous photographic development as is the case in the commonly known silver complex diffusion transfer process, but rather by electrolytic reduction, similar to what takes place when a solution of noble metal ions is brought into contact with the surface of a less noble metal. An image is formed on the aluminium surface because the soluble silver ions are removed from the reaction medium, to form a silver image as a result of the diminution in concentration of silver salts at such surface. According to the disclosed process, the aluminium providing the plate surface should have a certain degree of impurity, because when the aluminium has too high a degree of purity, the anchorage of the silver image onto the aluminium is impaired. The deposition and anchorage of silver images onto aluminium surface according to the diffusion transfer process is possible only after the aluminium oxide layer on the surface of the aluminium has been removed.

Such an aluminium oxide layer spontaneously forms on the surface of an aluminium plate, sheet, foil or covering layer when the aluminium is exposed to air. This phenomenon is undesirable in the above described process and therefore this aluminium oxide layer should be removed or caused to be converted. The removal or conversion of said undesired aluminium oxide layer can be achieved by dissolution in a processing medium containing alkaline substance and a solvent medium for the non-exposed silver halide. The removal should take place prior to contact of the light-sensitive material with the image-receiving member consisting of an aluminium plate, foil or sheet or a support provided with an aluminium layer, otherwise only a part or none of the complexed silver complex would be reduced on the aluminium or aluminium covered support, resulting in a faint image or a total absence of image on the planograph printing member.

The aluminium oxide layer can be removed or converted by treating it with an alkaline solution. As a result of the chemical reaction between these components an alkaline aluminate is formed. When the alkaline processing solution is repeatedly used it becomes more and more contaminated with alkaline aluminate so that the reaction speed decreases and after a certain time the solution loses its power to act on aluminium oxide. In other words the treating liquid is exhausted. Since no more alkaline aluminate salt can be formed, the liquid can no longer remove an aluminium oxide layer on an aluminium or aluminium covered image-receiving member. The electrochemical reaction between the Al ions and silver thiosulphate ions to form metallic silver becomes impossible.

It is an object of the present invention to counteract or reduce the exhaustion of an alkaline processing medium used in a silver complex diffusion transfer process.

It is a further object of the present invention to provide an alkaline aqueous liquid for use in the formation of a diffusion transfer image on aluminium sheet or an aluminium coated support serving for planographic printing.

According to the present invention, in a silver complex diffusion transfer process using a processing liquid containing at least one alkaline substance and a silver halide solvent preferably a thiosulphate complexing agent for forming a diffusion transfer image on an aluminium support or supported aluminium layer to produce a planographic printing plate, the processing liquid used contains at least one compound being within the scope of the following formula: MOOC—X—COOM
wherein:
X is either —CH=CH—,

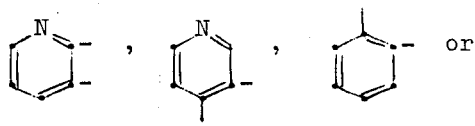

or

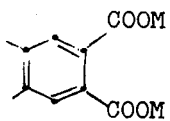

and M is an alkali metal.

It has been established experimentally that the presence of one or more of said compounds as specified above prolonges the treating power of the alkaline liquid. a given quantity of alkaline processing liquid can therefore be used in the production of a larger number of planographic printing plates.

Preferably the alkaline processing liquid has a pH-value between 12.5 and 13.1. The compounds identified above are particularly effective under those conditions. The efficacy of the said compounds appears to be best when the processing liquid is kept at a temperature between 18° and 28° C. Preferably the silver halide material and the image-receiving aluminium support or aluminium support layer are kept in close contact for at least 5 seconds.

According to a preferred embodiment the processing liquid contains a compound according to the above general formula in an amount equivalent to at least 2.5 g/l of the acid form of that compound.

Preferably phthalic or maleic acids are added to the alkaline processing liquid for the result aimed at.

According to a preferred embodiment the pH-value of the processing liquid is between 12.5 and 13.1 by the presence of sodium or lithium hydroxide.

The processing liquid used in the process of the present invention may contain in addition to an alkaline substance, e.g. sodium hydroxide, potassium hydroxide or lithium hydroxide, a preserving agent, e.g. sodium sulphite, a thickening agent e.g. hydroxyethylcellulose or carboxymethylcellulose, a foginhibiting agent such as potassium bromide and, if necessary developing agents, such as hydroquinone and 1-phenyl-3-pyrazolidinone, development nuclei, and silver halide solvents e.g. sodium thiosulphate. The processing liquid need not contain developing agent(s) if the light-sensitive layer or a layer in water-permeable relationship therewith contains appropriate developing agent(s). In that case the processing liquid is not a developing composition properly so-called but an activating liquid.

It is believed that an alkaline aluminate salt formed as a result of a reaction between an aluminium oxide surface layer and an alkaline processing solution, is complexed by at least one of the compounds as above specified, thus preventing the formation of ever increasing amounts of alkaline aluminate salt and further preventing the said reaction mechanism from coming to an end at any early stage. However, the invention is not dependent on any theory or explanation.

The light-sensitive silver halide material used in performing the present invention contains at least one silver halide emulsion layer coated on at least one side of a support. As emulsion layer suitable for use in the method according to the present invention any light-sensitive silver halide emulsion, either negative or direct-positive, can be used provided the development of the image-wise exposed light-sensitive silver halide layer proceeds sufficiently fast and a satisfactory complex formation of the non-developed silver halide is obtained. In view of these requirements and in order to obtain a satisfactory gradation necessary for graphic purposes, in practice mainly silver chloride emulsions are used, which may contain bromide and iodide or mixtures thereof or other ingredients necessary for obtaining the desired emulsion characteristics. The light-sensitive emulsion layer containing silver halide is preferably unhardened.

The binder for the light-sensitive material is preferably gelatin. However, the gelatin may be replaced wholly or partly by other natural and/or synthetic hydrophilic colloids e.g. albumin, casein or zein, polyvinyl alcohol, sodium salts of alginic acids, sodium salts of cellulose derivatives such as sodium salt of carboxymethylcellulose. The emulsion layer and/or one or more layers in water-permeable relationship with the silver halide emulsion layer may comprise any of the compounds customarily used in such layers for carrying out the silver complex diffusion transfer process. These compounds include e.g. developing agents such as hydroquinone, preferably in an amount of 0.3 to 3 g/sq.m and/or 1-phenyl-4-methyl-3-pyrazolidinone, preferably in an amount of 0.075 to 0.75 g/sq.m.; also coating agents, stabilizing agents, antifogging agents, plasticizers, development accelerators e.g. polyoxyalkylene compounds and onium compounds, spectral sensitizing agents, etc.

The emulsion is usually coated on a support in such a way that the amount of silver present in the resulting light-sensitive layer is equivalent with an amount of silver nitrate of approximately 0.5 to approximately 3.5 g/sq.m. The support for the light-sensitive silver halide emulsion may be any of the supports customarily employed in the art, e.g. a support of paper, glass, film e.g. cellulose acetate film, polyvinyl acetal film, polystyrene film, polyethylene terephthalate film, metal, metalized paper or metal/paper laminate. Paper supports coated on one or both sides with an α-olefin polymer e.g. polyethylene can also be used. In order to compensate for the curling tendency of the light-sensitive material one side of the support can be coated with a polyethylene layer, whose specific density and/or thickness differs from that on the other side of the support. The compensation for the curling tendency of the material can also be improved by incorporation of matting agents into these coatings.

The emulsion-coated side of the support of the light-sensitive material can be provided with a top layer, which may be a layer free from gelatin and containing a water-permeable colloid. The top layer is of such nature that the diffusion is not inhibited or restrained and that it acts e.g. as an antistress layer. Appropriate water-permeable binding agents for the layer coated on top of the light-sensitive silver halide emulsion layer are e.g. methylcellulose, the sodium salt of carboxymethylcellulose, hydroxyethylcellulose, hydroxyethyl starch, hydroxypropyl starch, sodium alginate, gum tragacanth, starch, polyvinyl alcohol, polyacrylic acid, polyacrylamide, polyvinyl pyrrolidone, polyoxyethylene, copoly(methylvinylether/maleic acid), etc.

The thickness of a said top layer may vary according to the nature of the colloid used. Such layer, if present, may be transferred at least partially to the image-receiving material when the diffusion process comes to an end.

The image-receiving material according to the present invention comprise an aluminium sheet, foil, plate or the like or any other kind of support bearing an aluminium layer which has been applied by any suitable technique e.g. lamination vacuum deposition etc.

In the silver complex diffusion transfer process according to the present invention use can be made of separate light-sensitive and image-receiving materials which are brought into contact to permit the diffusion to take place. The sequence of layers can be chosen in relation to the end result aimed at.

For more particulars about exposure and developing apparatus, which may be applied in a process according to the present invention as well as particulars on the silver halide diffusion process in general there can be referred to "Photographic Silver Halide Diffusion Processes", by A. Rott and E. Weyde, Focal Press London, New-York 1972 and to the patent literature cited therein.

Other objects in addition to those embodying the present invention will become apparent upon examination of the following examples.

EXAMPLE 1

Cadmium chloride is added to a silver chloride emulsion ready for coating in such a way that the coated emulsion layer contains 1.43 g of silver and 0.51 g of cadmium per sq.m. The emulsion is coated on a baryta-coated paper base and the light-sensitive paper thus obtained is image-wise exposed. The exposed negative and an aluminium sheet consisting of 99.5% of aluminium and 0.5% of magnesium and silicone, the surface of which is brushed to grain depths of 2 to 4μ, are passed through a usual apparatus for carrying out the diffusion transfer process. This apparatus contains an aqueous developer solution of the following composition:

| | |
|---|---|
| sodium hydroxide | 11.5 g |
| sodium sulphite | 90 g |
| sodium thiosulphate | 3.5 g |
| potassium bromide | 0.75 g |
| hydroquinone | 10 g |
| 1-phenyl-3-pyrazolidinone | 1.5 g |
| trisodium salt of ethylene diamine tetraacetic acid | 3.5 g |
| carboxymethylcellulose | 10 g |
| water to make | 1000 ml |
| pH value 13.1 | |

The negative and the aluminium plate are passed through this solution and brought into contact between rubber rollers. The paper sheet carrying the emulsion layer is separated from the aluminium sheet, thus leaving a silver image on the aluminium sheet. The silver image firmer adheres to the surface of said aluminium sheet. Immediately thereafter, the sheet bearing the image is rubbed for approximately 30 seconds with a cloth soaked with a lithographic preparation having the following composition:

| | |
|---|---|
| carboxymethylcellulose | 3.24 g |
| sodium phosphate | 0.6 g |
| phosphoric acid | 0.3 g |
| n-hexadecyl trimethyl ammonium bromide | 0.06 g |
| 10 % aqueous solution of formaldehyde | 1 g |
| water to make | 100 ml |

The lithographic printing plate is now ready for use.

The developer described in this example is capable of processing 55 aluminium plates having a size of 254 × 381 mm, provided all of them are processed one after the other so that the effect of exhaustion by aerial oxidation or exhaustion by long standing between the different processing periods of the plates is reduced to a minimum.

EXAMPLE 2

Example 1 is repeated with the same ingredients, proportions and conditions except for the use of 10 g of maleic acid per liter of developer and the adjustment of the pH value of the said developer to 13.1. This pH value is obtained by increasing the amount of sodium hydroxide to 18 g/liter of developer.

In these conditions it is possible to process 99 aluminium plates of the same size as described in example 1.

EXAMPLE 3

Example 1 is repeated with the same ingredients proportions, and conditions, except for the use of 20 g of phthalic acid per liter of developer and the adjustment of the pH value to 13.1 by increasing the amount of sodium hydroxide to 21.5 g per liter of developer.

In these conditions it is possible to process 99 aluminium plates of the same size as in example 1.

EXAMPLE 4

Example 1 is repeated with the same ingredients proportions, and conditions, except for the use of 20 g of dicarboxypyridine per liter of developer and the adjustment of the pH value to 13.1 by increasing the amount of sodium hydroxide to 24 g per liter of developer.

EXAMPLE 5

Example 1 is repeated with the same ingredients proportions, and conditions, except for the use of 5 g of pyromellitic acid per liter of developer and the adjustment of the pH value to 13.1 by increasing the amount of sodium hydroxide to 19 g per liter of developer.

In these conditions it is possible to process 99 aluminium plates of the same size as in example 1.

We claim:

1. In a process of producing a planographic printing plate by forming a diffusion transfer image on an aluminium sheet or foil or on a supported aluminum layer serving as an image receiving material through the steps of image-wise exposing a light-sensitive silver halide material, treating said material with an aqueous alkaline liquid to develop the exposed material by means of developing agents present in said material and/or liquid, and to dissolve unexposed silver halide by means of a silver halide solvent present in said liquid, and contacting said material with the said image receiving material to form the diffusion transfer image, the improvement which comprises using as the aqueous alkaline liquid a liquid containing, in an amount sufficient to increase the lifetime of said alkaline liquid, at least one compound of the formula

MOOC—X—COOM wherein X is

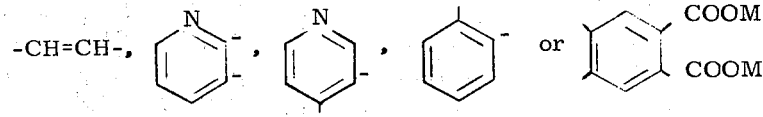

and

M is an alkali metal,

2. A process according to claim 1 wherein said aqueous alkaline liquid has a pH value between 12.5 and 13.1.

3. A process according to claim 1, wherein said aqueous alkaline liquid has a temperature between 18° C and 28° C.

4. A process according to claim 1, wherein said aqueous alkaline liquid contains said compound MOOC—X—COOM in an amount equivalent to at least 2.5 g/l of the acid form of that compound.

5. A process according to claim 1 wherein said aqueous alkaline liquid has the composition -

| water | 800 ml |
|---|---|
| maleic acid | 10 g |
| NaOH | 18 g |
| Na₂SO₃ | 90 g |
| hydroquinone | 10 g |
| 1-phenyl-3-pyrazolidinone | 1.5 g |
| carboxymethyl cellulose | 10 g |
| KBr | 0.75 g |
| sequestrene | 3.5 g |
| Na₂S₂O₃ | 3.5 g |
| water to make | 1000 ml. |

6. A process according to claim 2 wherein said pH value is adjusted by the presence of sodium or lithium hydroxide.

* * * * *